US012615029B2

(12) United States Patent
Harai

(10) Patent No.: US 12,615,029 B2
(45) Date of Patent: Apr. 28, 2026

(54) ACOUSTIC WAVE DEVICE, FILTER, MULTIPLEXER, AND WAFER

(71) Applicant: TAIYO YUDEN CO., LTD., Tokyo (JP)

(72) Inventor: Shodai Harai, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 274 days.

(21) Appl. No.: 18/479,969

(22) Filed: Oct. 3, 2023

(65) Prior Publication Data

US 2024/0136997 A1 Apr. 25, 2024

(30) Foreign Application Priority Data

Oct. 12, 2022 (JP) ................................. 2022-163926

(51) Int. Cl.
*H03H 9/02* (2006.01)
*H03H 9/13* (2006.01)
*H03H 9/56* (2006.01)
*H03H 9/70* (2006.01)

(52) U.S. Cl.
CPC .... *H03H 9/02157* (2013.01); *H03H 9/02031* (2013.01); *H03H 9/133* (2013.01); *H03H 9/568* (2013.01); *H03H 9/703* (2013.01)

(58) Field of Classification Search
CPC ........... H03H 9/02157; H03H 9/02031; H03H 9/133; H03H 9/568; H03H 9/703; H03H 9/02559; H03H 9/02574
USPC .................................................. 333/193–196
See application file for complete search history.

(56) References Cited

U.S. PATENT DOCUMENTS

| | | | |
|---|---|---|---|
| 10,020,796 B2 | 7/2018 | Gilbert et al. | |
| 2017/0033765 A1 | 2/2017 | Moriya et al. | |
| 2018/0159497 A1 | 6/2018 | Iwamoto et al. | |
| 2021/0288628 A1* | 9/2021 | Nishimura | ......... H03H 9/02834 |

FOREIGN PATENT DOCUMENTS

| | | |
|---|---|---|
| JP | 2015-115870 A | 6/2015 |
| JP | 2015-122566 A | 7/2015 |
| JP | 2017-034363 A | 2/2017 |
| JP | 2019-201345 A | 11/2019 |
| JP | 2022-025374 A | 2/2022 |
| WO | WO 2017/043427 A1 | 3/2017 |

* cited by examiner

*Primary Examiner* — Jorge L Salazar, Jr.
(74) *Attorney, Agent, or Firm* — Stein IP, LLC

(57) ABSTRACT

An acoustic wave device includes a substrate, a piezoelectric layer provided on the substrate, at least one pair of comb-shaped electrodes provided on the piezoelectric layer, the at least one pair of comb-shaped electrodes including a plurality of electrode fingers having an average pitch equal to or greater than 0.5 times a thickness of the piezoelectric layer, a first insulating layer provided between the substrate and the piezoelectric layer, the first insulating layer having an acoustic velocity of a bulk wave higher than an acoustic velocity of a bulk wave in the piezoelectric layer, and a second insulating layer provided between the first insulating layer and the piezoelectric layer, the second insulating layer having an acoustic velocity of a bulk wave higher than the acoustic velocity of the bulk wave in the first insulating layer.

16 Claims, 12 Drawing Sheets

ACOUSTIC WAVE DEVICE, FILTER, MULTIPLEXER, AND WAFER

CROSS-REFERENCE TO RELATED APPLICATION

This application is based upon and claims the benefit of priority of the prior Japanese Patent Application No. 2022-163926, filed on Oct. 12, 2022, the entire contents of which are incorporated herein by reference.

FIELD

A certain aspect of the present disclosure relates to an acoustic wave device, a filter, a multiplexer, and a wafer.

BACKGROUND

A surface acoustic wave resonator is known as an acoustic wave resonator used in a communication device such as a smartphone. It is known to bond a piezoelectric layer forming a surface acoustic wave resonator to a support substrate. It is known to adjust the thickness of the piezoelectric layer to be equal to or less than the wavelength of the surface acoustic wave as disclosed in, for example, Japanese Patent Application Laid-Open No. 2017-034363 (Patent Document 1). It is known to provide a low acoustic velocity layer having an acoustic velocity lower than that of the piezoelectric layer between the piezoelectric layer and the support substrate as disclosed in, for example, Japanese Patent Application Laid-Open Nos. 2015-115870, 2015-122566, 2019-201345, and 2022-25374, U.S. Pat. No. 10,020,796, and International Publication No. 2017/043427 (Patent Documents 2 to 7, respectively). It is known to provide a high acoustic velocity layer having an acoustic velocity higher than that of the piezoelectric layer between the low acoustic velocity layer and the support substrate as disclosed in, for example, Patent Documents 2 and 3.

SUMMARY

The spurious response can be reduced by providing the high acoustic velocity layer between the low acoustic velocity layer and the support substrate. However, the main response may be degraded.

Therefore, an object of the present disclosure is to reduce deterioration in a main response and reduce a spurious response.

In one aspect of the present disclosure, there is provided an acoustic wave device including: a substrate; a piezoelectric layer provided on the substrate; at least one pair of comb-shaped electrodes provided on the piezoelectric layer, the at least one pair of comb-shaped electrodes including a plurality of electrode fingers having an average pitch equal to or greater than 0.5 times a thickness of the piezoelectric layer; a first insulating layer provided between the substrate and the piezoelectric layer, the first insulating layer having an acoustic velocity of a bulk wave higher than an acoustic velocity of a bulk wave in the piezoelectric layer; and a second insulating layer provided between the first insulating layer and the piezoelectric layer, the second insulating layer having an acoustic velocity of a bulk wave higher than the acoustic velocity of the bulk wave in the first insulating layer.

In another aspect of the present disclosure, there is provided an acoustic wave device including: a substrate that is a monocrystalline sapphire substrate; a piezoelectric layer provided on the substrate, the piezoelectric layer being a rotated Y-cut X-propagation lithium tantalate substrate; at least one pair of comb-shaped electrodes provided on the piezoelectric layer, the at least one pair of comb-shaped electrodes including a plurality of electrode fingers having an average pitch equal to or greater than 0.5 times a thickness of the piezoelectric layer; a first insulating layer provided between the substrate and the piezoelectric layer, the first insulating layer being a polycrystalline or amorphous aluminum oxide layer; a second insulating layer provided between the first insulating layer and the piezoelectric layer, the second insulating layer having a thickness equal to or less than three times the average pitch, the second insulating layer being a polycrystalline or amorphous aluminum oxynitride layer, a polycrystalline or amorphous aluminum nitride layer, a polycrystalline or amorphous silicon layer, a polycrystalline or amorphous silicon nitride layer, or a polycrystalline or amorphous titanium nitride layer; and a third insulating layer provided between the piezoelectric layer and the second insulating layer, a distance between an interface between the third insulating layer and the second insulating layer and an interface between the piezoelectric layer and the at least one pair of comb-shaped electrodes being equal to or less than two times the average pitch, the third insulating layer being a silicon oxide layer or a silicon oxide layer to which fluorine is added.

In another aspect of the present disclosure, there is provided an acoustic wave device including: a substrate that is a monocrystalline sapphire substrate; a piezoelectric layer provided on the substrate, the piezoelectric layer being a rotated Y-cut X-propagation lithium tantalate substrate; at least one pair of comb-shaped electrodes provided on the piezoelectric layer, the at least one pair of comb-shaped electrodes including a plurality of electrode fingers having an average pitch equal to or greater than 0.5 times a thickness of the piezoelectric layer; a first insulating layer provided between the substrate and the piezoelectric layer, the first insulating layer being a polycrystalline or amorphous aluminum oxide layer; a second insulating layer provided between the first insulating layer and the piezoelectric layer, the second insulating layer having a thickness equal to or less than 0.8 times the average pitch, the second insulating layer being a polycrystalline or amorphous silicon carbide layer or a diamond-like carbon layer; and a third insulating layer provided between the piezoelectric layer and the second insulating layer, a distance between an interface between the third insulating layer and the second insulating layer and an interface between the piezoelectric layer and the at least one pair of comb-shaped electrodes being equal to or less than two times the average pitch, the third insulating layer being a silicon oxide layer or a silicon oxide layer to which fluorine is added.

In another aspect of the present disclosure, there is provided a filter including the above acoustic wave device.

In another aspect of the present disclosure, there is provided a multiplexer including the above filter.

In another aspect of the present disclosure, there is provided a wafer including: a substrate; a piezoelectric layer provided on the substrate, the piezoelectric layer being a rotated Y-cut X-propagation lithium tantalate substrate; a first insulating layer provided between the substrate and the piezoelectric layer, the first insulating layer being a polycrystalline or amorphous aluminum oxide layer; and a second insulating layer provided between the first insulating layer and the piezoelectric layer, the second insulating layer having an acoustic velocity of a bulk wave higher than an acoustic velocity of a bulk wave in the first insulating layer and lower than an acoustic velocity of a bulk wave in the substrate.

DETAILED DESCRIPTION

Hereinafter, embodiments of the present disclosure will be described with reference to the drawings.

First Embodiment

Figure 1A:
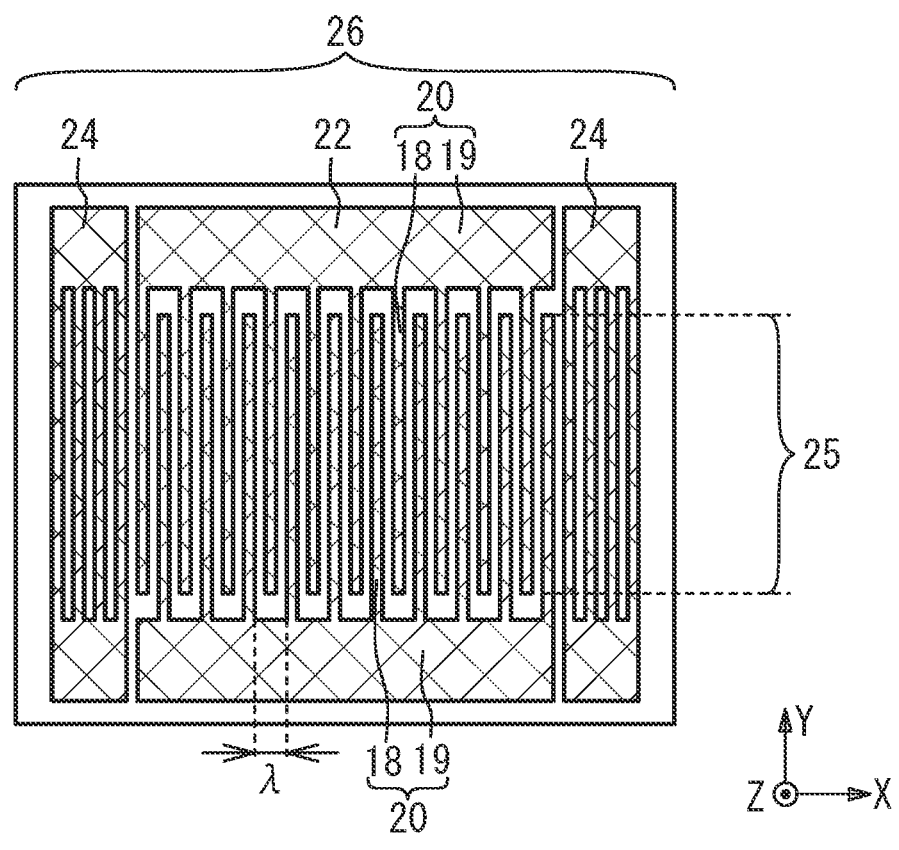
FIG. 1A and FIG. 1B are a plan view and a cross-sectional view of an acoustic wave resonator in accordance with a first embodiment, respectively.
Figure 1B:
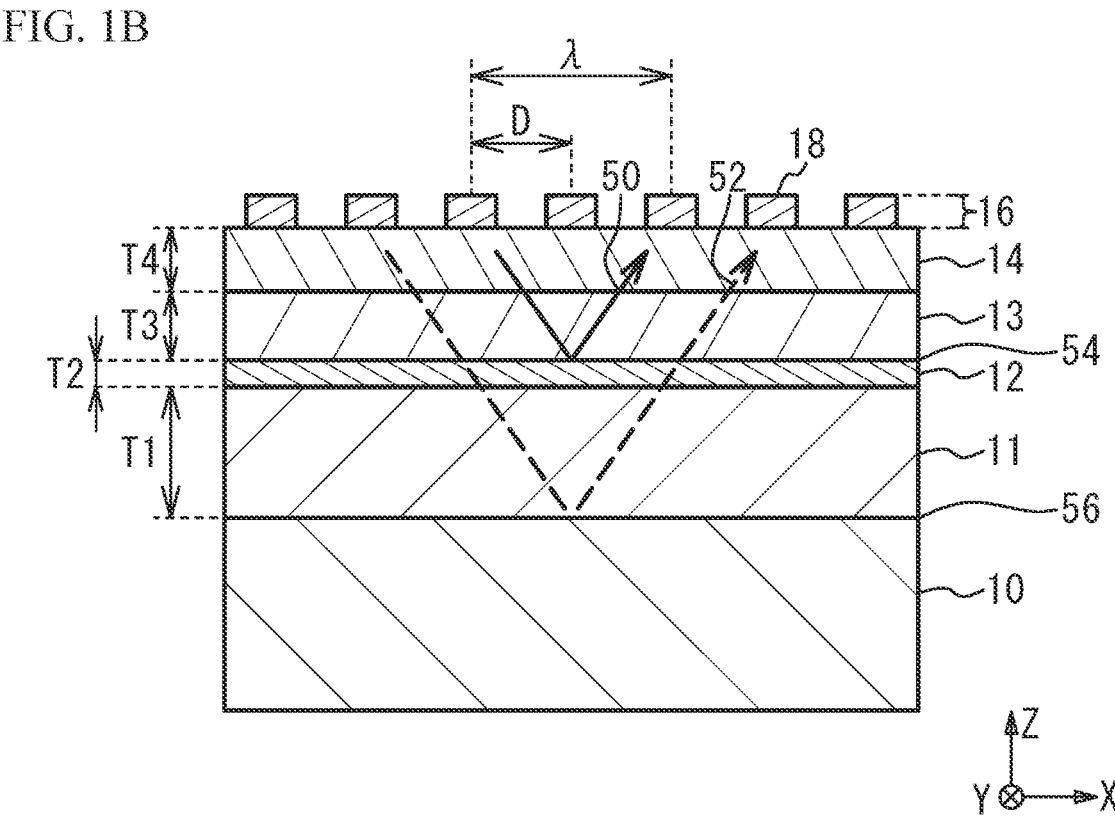

In a first embodiment, an example in which an acoustic wave device includes an acoustic wave resonator will be described. FIG. 1A and FIG. 1B are a plan view and a cross-sectional view of an acoustic wave resonator in accordance with a first embodiment. The direction in which electrode fingers are arranged (an arrangement direction of the electrode fingers) is defined as an X direction, an extending direction of the electrode fingers is defined as a Y direction, and a stacking direction of a support substrate and a piezoelectric layer is defined as a Z direction. The X direction, the Y direction, and the Z direction do not necessarily correspond to the X-axis orientation and the Y-axis orientation of the crystal orientations of the piezoelectric layer. When the piezoelectric layer is a rotated Y-cut X-propagation substrate, the X direction is the X-axis orientation of the crystal orientations.

As illustrated in FIG. 1A and FIG. 1B, a piezoelectric layer 14 is provided on a support substrate 10 (a substrate). An insulating layer 11 (a first insulating layer) is provided between the support substrate 10 and the piezoelectric layer 14. An insulating layer 12 (a second insulating layer) is provided between the insulating layer 11 and the piezoelectric layer 14. An insulating layer 13 (a third insulating layer) is provided between the insulating layer 12 and the piezoelectric layer 14. The thicknesses of the insulating layers 11, 12, and 13 and the piezoelectric layer 14 are represented by T1, T2, T3, and T4, respectively.

An acoustic wave resonator 26 is provided on the piezoelectric layer 14. The acoustic wave resonator 26 has an interdigital transducer (IDT) 22 and reflectors 24. The reflectors 24 are provided at both sides of the IDT 22 in the X direction. The IDT 22 and the reflectors 24 are formed of a metal film 16 on the piezoelectric layer 14.

The IDT 22 includes a pair of comb-shaped electrodes 20 opposing each other. The comb-shaped electrode 20 includes a plurality of electrode fingers 18 and a bus bar 19 to which the electrode fingers 18 are connected. A region where the electrode fingers 18 of one of the pair of the comb-shaped electrodes 20 overlap the electrode fingers 18 of the other of the pair of the comb-shaped electrodes 20 is an overlap region 25. The length of the overlap region 25 is the aperture length. The electrode fingers 18 of one of the pair of the comb-shaped electrodes 20 and the electrode fingers 18 of the other of the pair of the comb-shaped electrodes 20 are alternately provided one by one in at least a part of the overlap region 25. The acoustic wave mainly excited by the electrode fingers 18 in the overlap region 25 propagates mainly in the X direction. The pitch of the electrode fingers 18 of one of the pair of the comb-shaped electrodes 20 is substantially equal to the wavelength λ of the acoustic wave. When the pitch of the electrode fingers 18 (the pitch between the centers of the electrode fingers 18) is represented by D, the pitch of the electrode fingers 18 of one of the comb-shaped electrodes 20 is two times the pitch D. The reflectors 24 reflect the acoustic wave excited by the electrode fingers 18 of the IDT 22. As a result, the acoustic wave is confined in the overlap region 25 of the IDT 22.

The piezoelectric layer 14 is, for example, a monocrystalline lithium tantalate (LiTaO₃) layer or a monocrystalline lithium niobate (LiNbO₃) layer, and is, for example, a rotated Y-cut X-propagation lithium tantalate layer or a rotated Y-cut X-propagation lithium niobate layer. The thickness T4 of the piezoelectric layer 14 is preferably 1λ or less, and more preferably 0.5λ or less to reduce spurious emissions and loss. When the piezoelectric layer 14 is too thin, it is difficult to excite an acoustic wave. Therefore, the thickness T4 is preferably 0.1λ or greater.

The support substrate 10 is, for example, a sapphire substrate, an alumina substrate, a silicon substrate, a spinel substrate, a crystal substrate, a quartz substrate, or a silicon carbide substrate. The sapphire substrate is a monocrystalline $Al_2O_3$ substrate, the alumina substrate is a polycrystalline or amorphous $Al_2O_3$ substrate, the silicon substrate is a monocrystalline or polycrystalline silicon substrate, the spinel substrate is a polycrystalline or amorphous $MgAl_2O_4$ substrate, the quartz substrate is a monocrystalline $SiO_2$ substrate, the quartz substrate is a polycrystalline or amorphous $SiO_2$ substrate, and the silicon carbide substrate is a polycrystalline or monocrystalline SiC substrate. The linear coefficient of expansion of the support substrate 10 in the X direction is smaller than the linear coefficient of expansion of the piezoelectric layer 14 in the X direction. Thus, the temperature dependence of frequency of the acoustic wave resonator can be reduced.

The acoustic velocity of the bulk wave propagating through the insulating layer 11 is higher than the acoustic velocity of the bulk wave propagating through the insulating layer 13 and the piezoelectric layer 14. As a result, the energy of the acoustic wave of the main response is confined in the piezoelectric layer 14 and the insulating layer 13. The insulating layer 11 is polycrystalline or amorphous, for example, and is an aluminum oxide layer, a silicon nitride layer, an aluminum nitride layer, or a silicon carbide layer. To confine the acoustic wave in the insulating layer 13 and the piezoelectric layer 14, the thickness T1 of the insulating layer 11 is preferably 0.3λ or greater, more preferably 1λ or greater. To improve the characteristics, each of the thicknesses T1 and T2 is preferably 10λ or less. The acoustic velocity of the bulk wave in each layer is the acoustic velocity $V_S$ of the lateral wave, and is expressed by Equation 1 where G is the rigidity modulus and ρ is the density.

$$V_s = \sqrt{\frac{G}{\rho}}$$  [Equation 1]

When the Young's modulus is E and the Poisson's ratio is v, the rigidity modulus G is expressed by Equation 2.

$$G = \frac{E}{2(1 + v)}$$  [Equation 2]

The Poisson's ratio v is 0.2 to 0.3, and is typically 0.25. Therefore, by measuring the Young's modulus and density of each layer, the acoustic velocity of the bulk wave in each layer can be calculated.

The insulating layer 13 is, for example, a temperature compensation film and has a temperature coefficient of an elastic constant that is opposite in sign to the temperature coefficient of the elastic constant of the piezoelectric layer 14. For example, the temperature coefficient of the elastic constant of the piezoelectric layer 14 is negative, and the temperature coefficient of the elastic constant of the insulating layer 13 is positive. The insulating layer 13 is, for example, a silicon oxide (SiO₂) layer with no additives or additive elements such as fluorine, and is, for example, polycrystalline or amorphous. Thus, the temperature coefficient of frequency of the acoustic wave resonator can be reduced. When the insulating layer 13 is a silicon oxide layer, the acoustic velocity of the bulk wave propagating through the insulating layer 13 is lower than the acoustic velocity of the bulk wave propagating through the piezoelectric layer 14.

In order for the insulating layer 13 to have the temperature compensation function, the energy of the acoustic wave of the main response is required to be present to some extent in the insulating layer 13. Although the section in which the energy of the surface acoustic wave is concentrated depends on the type of the surface acoustic wave, the energy of the surface acoustic wave is typically concentrated in the section from the upper surface of the piezoelectric layer 14 to a depth of 2λ(λ is the wavelength of the surface acoustic wave), and particularly concentrated in the section from the upper surface of the piezoelectric layer 14 to a depth of λ. Therefore, the distance (thickness T3+thickness T4) from the lower surface of the insulating layer 13 to the upper surface of the piezoelectric layer 14 is preferably 2λ or less, and more preferably 1λ or less.

The insulating layer 12 is a reflective layer that reflects the acoustic wave of the main response. The acoustic velocity of the bulk wave propagating through the insulating layer 12 is higher than the acoustic velocity of the bulk wave propagating through the insulating layer 11. The insulating layer 12 is, for example, polycrystalline or amorphous, and is an aluminum oxide layer, an aluminum nitride oxide layer, an aluminum nitride layer, a silicon layer, a silicon nitride layer, a silicon carbide layer, a titanium nitride layer, or a diamond-like carbon layer. A preferable range of the thickness T2 of the insulating layer 12 will be described later.

The metal film 16 is a film containing, for example, aluminum (Al), copper (Cu), or molybdenum (Mo) as a main component. An adhesion film such as a titanium (Ti) film, a chromium (Cr) film, or a titanium nitride (TiN) film may be provided between the electrode fingers 18 and the piezoelectric layer 14. The adhesion film is thinner than the electrode fingers 18. An insulating layer may be provided so as to cover the electrode fingers 18. The insulating layer functions as a protective film or a temperature compensation film.

The wavelength λ of the acoustic wave is, for example, 1 μm to 6 μm. The number of pairs of the electrode fingers 18 is, for example, 20 to 300 when two electrode fingers 18 are defined as a pair. The duty ratio of the IDT 22 is calculated by (the width of the electrode finger 18)/(the pitch of the electrode fingers 18), and is, for example, 30% to 70%. The aperture length of the IDT 22 is, for example, 10λ to 50λ. The wavelength λ of the acoustic wave is two times the average pitch D of the electrode fingers 18. The average pitch of the electrode fingers 18 can be calculated by dividing the width of the IDT 22 in the X direction by the number of the electrode fingers 18.

Comparative Example 1

Figure 2:
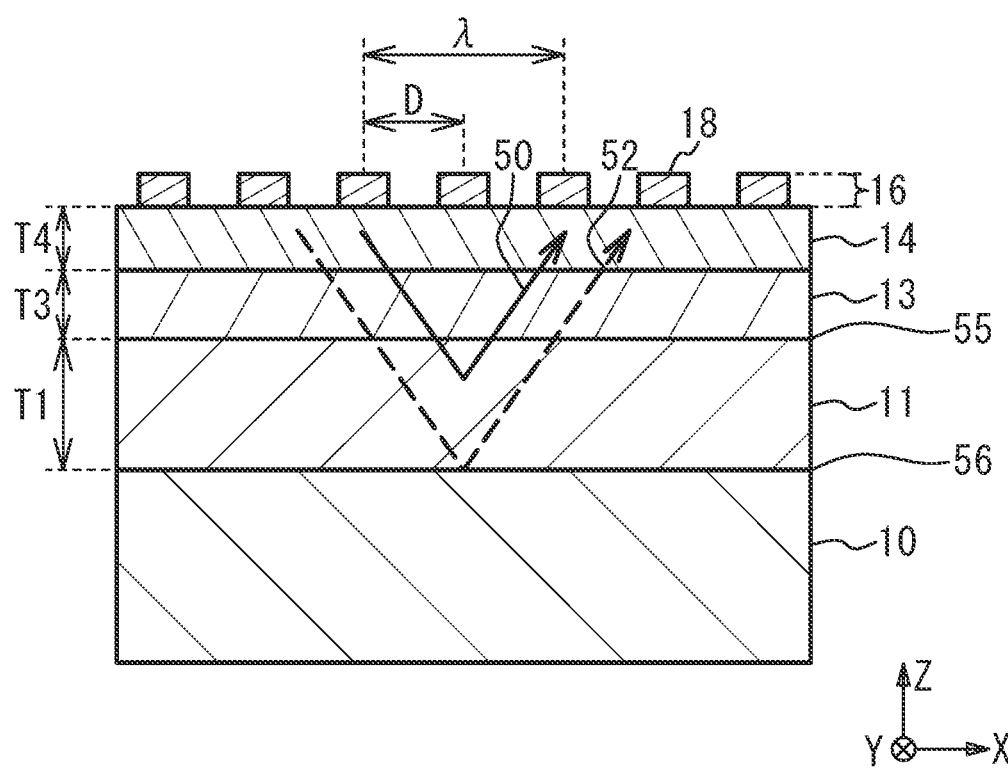
FIG. 2 is a cross-sectional view of an acoustic wave resonator in accordance with a comparative example 1.

FIG. 2 is a cross-sectional view of an acoustic wave resonator in accordance with a comparative example 1. As illustrated in FIG. 2, in the comparative example 1, the insulating layer 12 is not provided. Other configurations are the same as those of the first embodiment, and a description thereof is omitted.

[Simulation 1]

A simulation 1 of the main response and the spurious response was performed on the acoustic wave resonator of the comparative example 1 for different Q factors of the insulating layer 11. Conditions of the simulation 1 are as follows.

Support substrate 10: Sapphire substrate, Q factor=500

Insulating layer 11: Aluminum oxide layer, thickness T1=2.7λ, Q factor=Q1

Insulating layer 13: Silicon oxide layer, thickness T3=0.2λ, Q factor=Q3=500

Piezoelectric layer 14: 42° rotated Y-cut X-propagation lithium tantalate substrate, T4=0.3λ, Q factor=2000

Metal film 16: Aluminum film with a thickness of 0.07λ

Wavelength λ(i.e., 2×D) of the acoustic wave: 2.2 μm

The acoustic velocity of the bulk wave propagating through each layer is as follows.

Support substrate 10: V0=7068.2 m/s

Insulating layer 11: V1=4581.8 m/s

Insulating layer 13: V2=3683.5 m/s

Piezoelectric layer 14: V3=3750.8 m/s

The Q factor is a Q factor of vibration and is the reciprocal of the attenuation constant of the acoustic wave.

First, the acoustic velocity of the bulk wave in the insulating layer 11 was set to 4581.8 m/s, and the Q factor Q1 of the insulating layer 11 was changed to 1 time, 0.5 times, and 0.2 times the Q factor Q3 of the insulating layer 13.

Figure 3A:
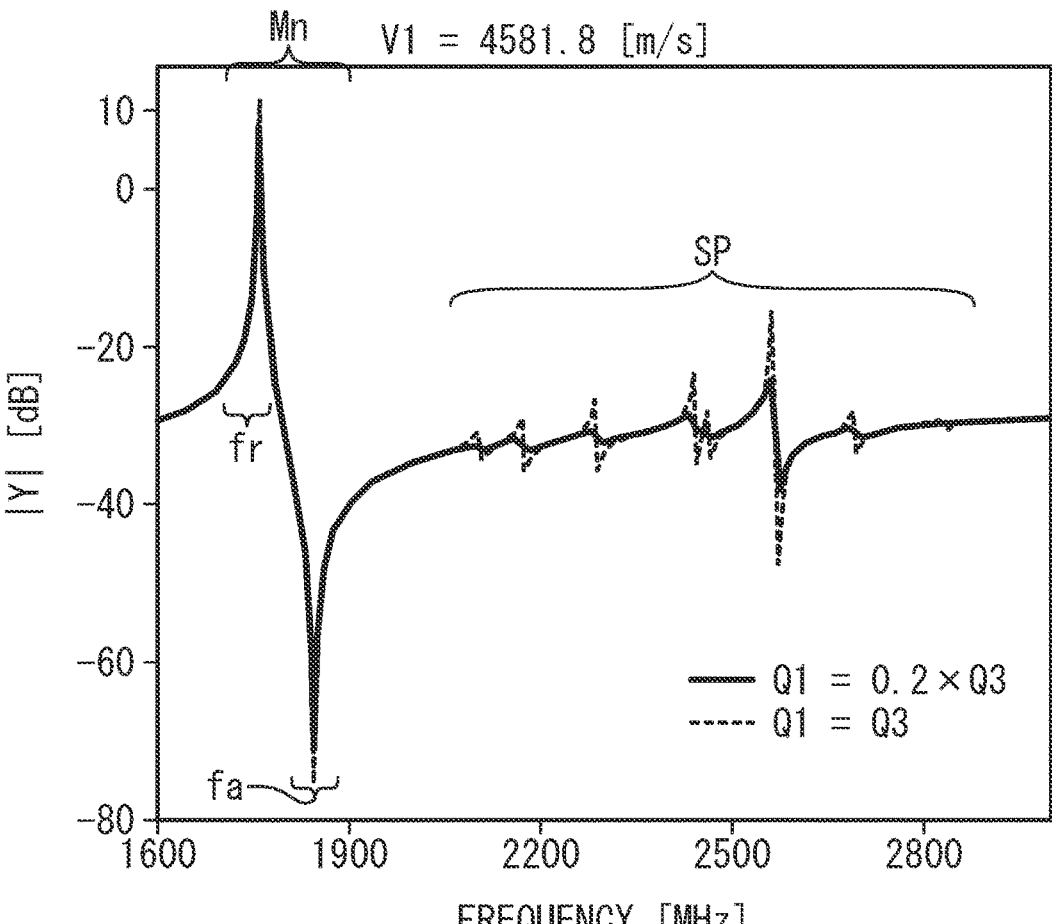
FIG. 3A is a graph presenting the absolute value |Y| of admittance versus frequency in a simulation 1.

FIG. 3A is a graph presenting the absolute value |Y| of admittance versus frequency in the simulation 1, and FIG.

Figure 3B:
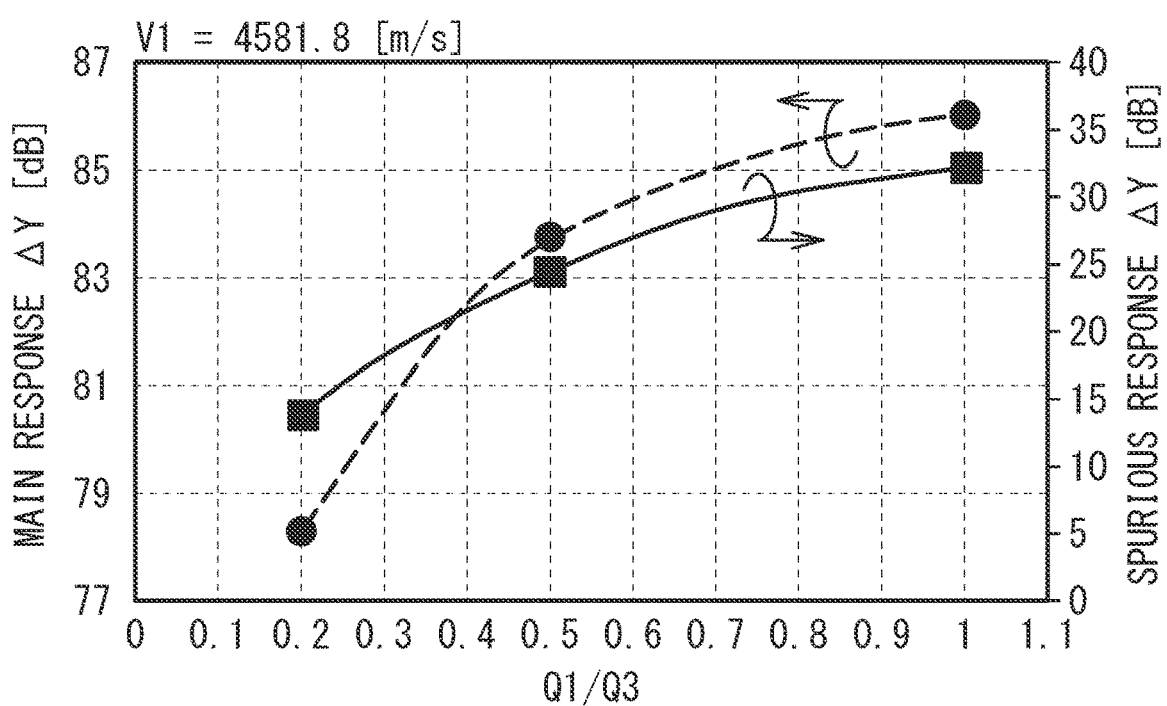
FIG. 3B is a graph presenting ΔY versus Q1/Q3.

3B is a graph presenting ΔY versus Q1/Q3. In FIG. 3B, dots indicate simulation points and a curve is an approximate curve. The main response ΔY is a difference between |Y| of the resonant frequency fr and |Y| of the antiresonant frequency fa in the main response Mn. The spurious response ΔY is a difference in |Y| of the response with the largest difference in |Y| in the spurious response Sp.

As illustrated in FIG. 3A, when Q1=0.2×Q3, the spurious response Sp is smaller than when Q1=Q3, but the difference between |Y| of the resonant frequency fr and |Y| of the antiresonant frequency fa in the main response Mn is also smaller. As illustrated in FIG. 3B, when Q1/Q3 is reduced, the spurious response ΔY is reduced, but the main response ΔY is also reduced. As described above, when the Q factor Q1 of the insulating layer 11 is decreased and the attenuation constant is increased, the spurious response ΔY is decreased, but the main response ΔY is also decreased.

[Simulation 2]

A simulation 2 of the main response and the spurious response was performed on the acoustic wave resonator of the comparative example 1 for different acoustic velocities V1 of the bulk wave in the insulating layer 11.

Insulating layer 11: Aluminum oxide layer, thickness T1=2.7λ, Q factor=0.5×Q3

Acoustic velocity of the bulk wave in the insulating layer 11: V1

Other simulation conditions are the same as those of the simulation 1.

Figure 4A:
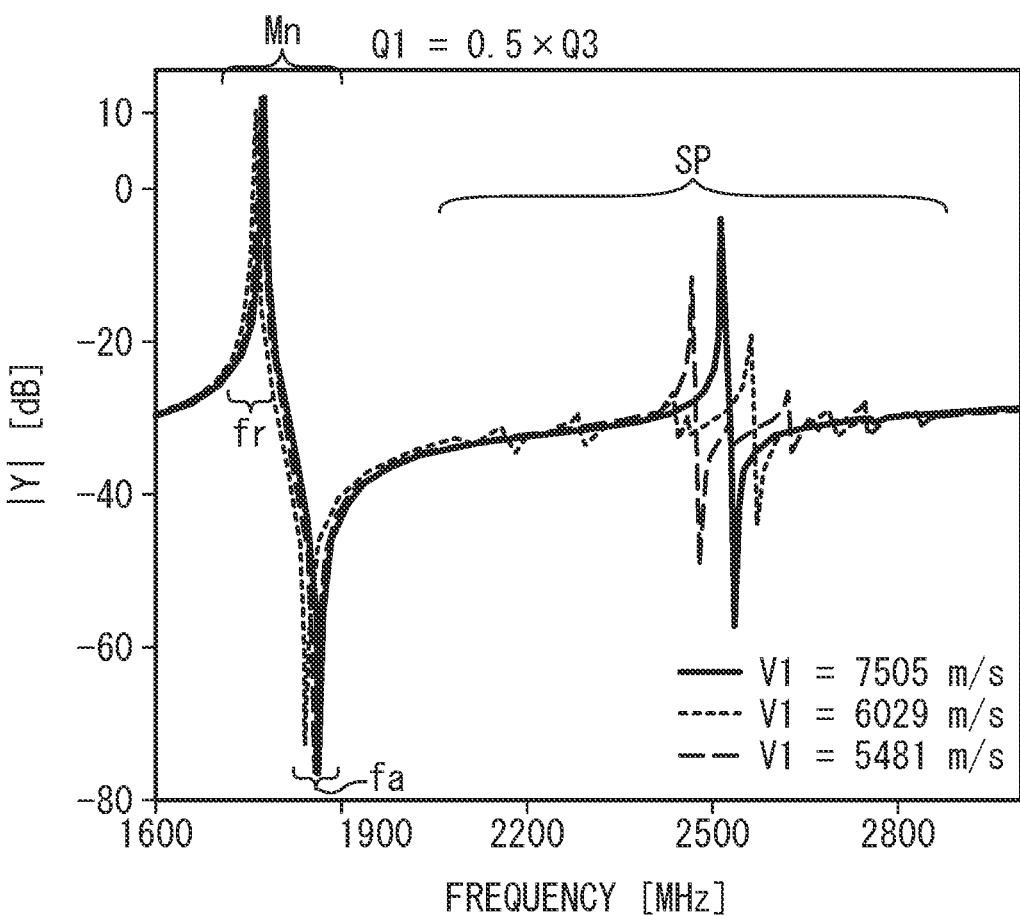
FIG. 4A is a graph presenting the absolute value |Y| of admittance versus frequency in a simulation 2.
Figure 4B:
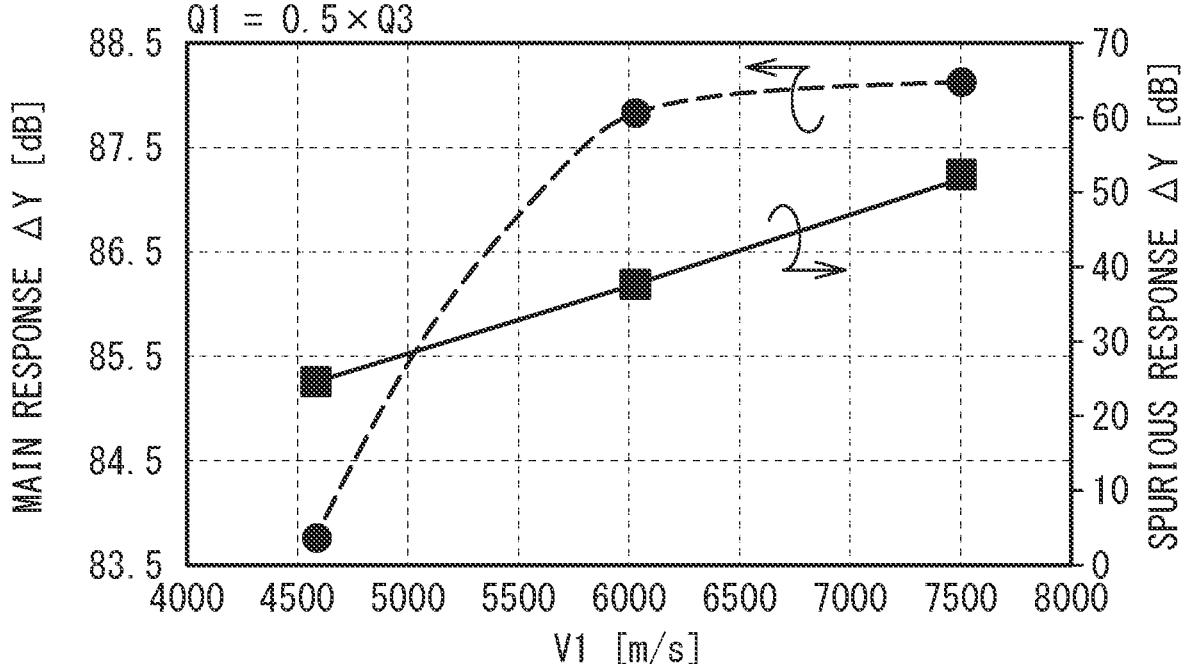
FIG. 4B is a graph presenting ΔY versus acoustic velocity V1 of a bulk wave in an insulating layer 11.

FIG. 4A is a graph presenting the absolute value |Y| of the admittance versus frequency in the simulation 2, and FIG. 4B is a graph presenting ΔY versus the acoustic velocity V1 of the bulk wave in the insulating layer 11. In FIG. 4B, dots indicate simulation points, and a curve is an approximate curve.

As illustrated in FIG. 4A and FIG. 4B, when the acoustic velocity V1 of the bulk wave in the insulating layer 11 is increased, ΔY of the main response Mn is increased, but ΔY of the spurious response Sp is also increased.

As in the simulations 1 and 2 of the comparative example 1, when ΔY of the spurious response Sp is decreased, ΔY of the main response Mn is decreased, and when ΔY of the main response Mn is increased, ΔY of the spurious response Sp is increased. Thus, it is difficult to reduce the deterioration in the main response and reduce the spurious response.

The reason why the main response deteriorates when the spurious response is reduced in the comparative example 1 will be described with reference to FIG. 2. The electrode fingers 18 excite a surface acoustic wave 50 of a main response and an unnecessary wave 52 of a spurious response. The surface acoustic wave 50 is, for example, a shear horizontal (SH) wave, and the unnecessary wave 52 is, for example, a bulk wave. As described in Patent Document 4, the surface acoustic wave 50 propagates through the section from the upper surface of the piezoelectric layer 14 to a depth of 2λ. Therefore, the confinement of the surface acoustic wave 50 and the attenuation of the unnecessary wave 52 will be considered for the case where the thickness T4 of the piezoelectric layer 14 is equal to or less than two times the average pitch D of the electrode fingers 18 (i.e., λ or less), that is, the average pitch D of the electrode fingers 18 is equal to or greater than 0.5 times the thickness T4 of the piezoelectric layer 14 and the sum of the thickness T3 of the insulating layer 13 and the thickness T4 of the piezoelectric layer 14 is equal to or less than four times the average pitch D of the electrode fingers 18 (i.e., (2×λ) or less).

When the unnecessary wave 52 is reflected by an interface 56 with the support substrate 10, a spurious response occurs. Therefore, the acoustic velocity V1 of the bulk wave in the insulating layer 11 is adjusted to be higher than the acoustic velocity V4 of the bulk wave in the piezoelectric layer 14 and the acoustic velocity V3 of the bulk wave in the insulating layer 13. The surface acoustic wave 50 having a low frequency is easily reflected at an interface 55 between the insulating layers 11 and 13. The unnecessary wave 52 (for example, a bulk wave) having a high frequency easily passes through the interface 55. The unnecessary wave 52 that has passed through the interface 55 is reflected at the interface 56 between the support substrate 10 and the insulating layer 11, returns to the electrode fingers 18, and becomes a spurious response. The unnecessary wave 52 passing through the insulating layer 11 can be attenuated by appropriately setting the thicknesses T1 and the Q factor Q1 of the insulating layer 11. Thus, the spurious response can be reduced. On the other hand, since the surface acoustic wave 50 is reflected at the interface 55 and is confined in the piezoelectric layer 14 and the insulating layer 13, the main response is less likely to be deteriorated.

However, in order to cause the surface acoustic wave 50 to be reflected at the interface 55 and cause the unnecessary wave 52 to pass through the interface 55, the acoustic velocity V1 of the bulk wave in the insulating layer 11 is required not to be excessively higher than the acoustic velocity V4 of the bulk wave in the piezoelectric layer 14 and the acoustic velocity V3 of the bulk wave in the insulating layer 13. For example, in the simulation 1, the acoustic velocity V1 of the bulk wave in the insulating layer 11 is 1.22 times the acoustic velocity V4 of the bulk wave in the piezoelectric layer 14, and 1.24 times the acoustic velocity V3 of the bulk wave in the insulating layer 13. In this case, the effect of confining the surface acoustic wave 50 is not sufficient, and a part of the surface acoustic wave 50 enters the insulating layer 11. Therefore, the surface acoustic wave 50 is attenuated, and the main response is deteriorated.

In the simulation 1, the spurious response can be reduced by lowering the Q factor Q1 of the insulating layer 11. However, since the surface acoustic wave 50 entering the insulating layer 11 is attenuated, the main response is deteriorated. In the simulation 2, by increasing the acoustic velocity V1 of the bulk wave in the insulating layer 11, it is possible to inhibit the surface acoustic wave 50 from entering the insulating layer 11 and to reduce the deterioration in the main response. However, when the acoustic velocity V1 of the bulk wave in the insulating layer 11 increases, the unnecessary wave 52 is likely to be reflected at the interface 55, and thus the spurious response increases.

First Embodiment

The reason why the spurious response can be reduced and deterioration in the main response can be reduced in the first embodiment will be described with reference to FIG. 1B. In the first embodiment, the insulating layer 12 (a second insulating layer) is provided between the insulating layer 11 (a first insulating layer) and the piezoelectric layer 14. The acoustic velocity V2 of the bulk wave in the insulating layer 12 is higher than the acoustic velocity V1 of the bulk wave in the insulating layer 11. Thus, the surface acoustic wave 50 is more likely to be reflected at an interface 54 between the insulating layers 12 and 13 and less likely to enter the insulating layer 11. As a result, deterioration in the main response can be reduced. The unnecessary wave 52 passes through the interface 54 and enters the insulating layer 11.

Thereby, the unnecessary wave 52 is attenuated in the insulating layer 11, and the spurious response can be reduced.

When the thickness T2 of the insulating layer 12 is too large, the unnecessary wave 52 is likely to be reflected at the interface 54. In this respect, the thickness T2 is preferably equal to or less than four times the average pitch D (i.e., (2×λ or less), more preferably equal to or less than three times the average pitch D (i.e., 1.5×λ or less), further preferably equal to or less than two times the average pitch D (i.e., 1×λ), and yet further preferably equal to or less than 0.8 times the average pitch D (i.e., 0.4×λ or less). From the viewpoint of facilitating reflection of the surface acoustic wave 50 at the interface 54, the thickness T2 is preferably equal to or greater than 0.02 times the average pitch D (i.e., 0.01×λ or greater), and more preferably equal to or greater than 0.2 times the average pitch D (i.e., 0.1×λ or greater).

If the acoustic velocity V2 of the bulk wave in the insulating layer 12 is too high, the unnecessary wave 52 is likely to be reflected at the interface 54. From this viewpoint, the acoustic velocity V2 of the bulk wave in the insulating layer 12 is preferably equal to or less than 2 times, more preferably equal to or less than 1.5 times, further preferably equal to or less than 1.35 times, and yet further preferably equal to or less than 1.1 times the acoustic velocity V1 of the bulk wave in the insulating layer 11. From the viewpoint of facilitating reflection of the surface acoustic wave 50 at the interface 54, the acoustic velocity V2 is preferably equal to or greater than 1.01 times, and more preferably equal to or greater than 1.02 times the acoustic velocity V1.

When the acoustic velocity V0 of the bulk wave in the support substrate 10 is high, the unnecessary wave 52 is likely to be reflected at the interface 56 in FIG. 1B and FIG. 2, and a spurious response is likely to occur. On the other hand, a hard material may be used for the support substrate 10 from the viewpoint of supporting each layer. When the acoustic velocity V0 of the bulk wave in the support substrate 10 is higher than the acoustic velocity V2 of the bulk wave in the insulating layer 12, it is preferable to provide the insulating layers 11 and 12. The acoustic velocity V0 of the bulk wave in the support substrate 10 is, for example, equal to or greater than 1.1 times the acoustic velocity V2 of the bulk wave in the insulating layer 12, or equal to or greater than 1.2 times the acoustic velocity V2 of the bulk wave in the insulating layer 12.

When the acoustic velocity V1 of the bulk wave in the insulating layer 11 is too high, the unnecessary wave 52 is less likely to enter the insulating layer 11. In this respect, the acoustic velocity V1 of the bulk wave in the insulating layer 11 is preferably equal to or less than 1.5 times and more preferably equal to or less than 1.3 times the acoustic velocity V4 of the bulk wave in the piezoelectric layer 14 and the acoustic velocity V3 of the bulk wave in the insulating layer 13. When the acoustic velocity V1 of the bulk wave in the insulating layer 11 is too low, the surface acoustic wave 50 enters the insulating layer 11. In this respect, the acoustic velocity V1 is preferably equal to or greater than 1.05 times and more preferably equal to or greater than 1.2 times the acoustic velocities V4 and V3.

[Simulation 3]

A simulation 3 of the main response and the spurious response was performed for different thicknesses T2 of the insulating layer 12 and different acoustic velocities of the bulk wave in the first embodiment. Conditions of the simulation 3 are as follows.

Insulating layer 11: Aluminum oxide layer, thickness T1=2.7λ, Q factor=Q1=250

Insulating layer 12: Thickness T2, Q value=Q2=500
  Acoustic velocity of the bulk wave in the insulating layer 11: V1=4581.8 m/s
  Acoustic velocity of the bulk wave in the insulating layer 12: V2

Other simulation conditions are the same as those of the simulation 1.

Figures 5A, 5B, 5C:
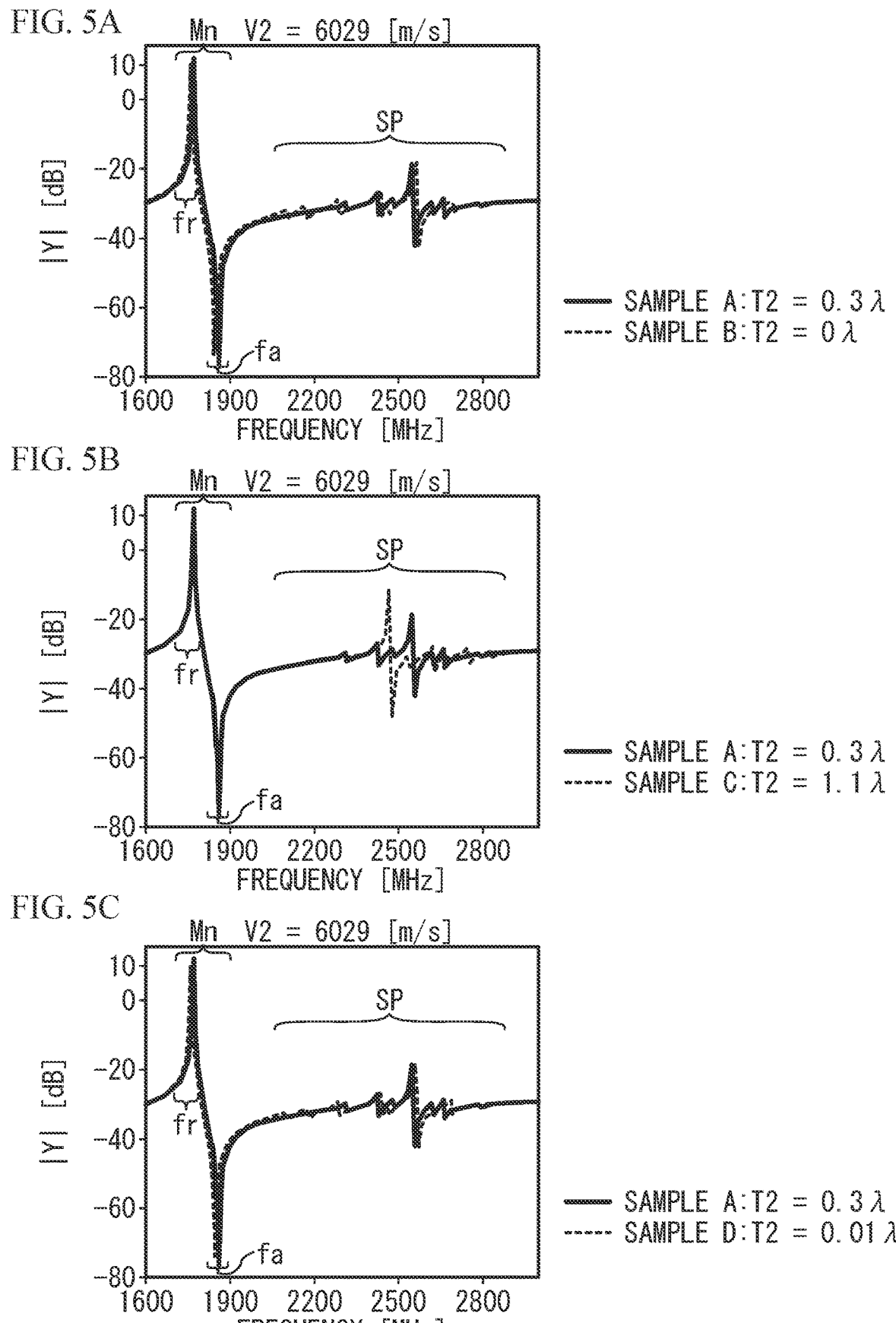
FIG. 5A to FIG. 5C are graphs presenting the absolute value |Y| of admittance versus frequency for samples A to D in a simulation 3.

FIG. 5A to FIG. 5C are graphs presenting the absolute value |Y| of admittance of samples A to D versus frequency in the simulation 3. The conditions of the samples A to D are as follows.

Sample A: T2=0.3λ, V2=6029 m/s=1.32×V1
  Sample B: T2=0λ(comparative example 1)
  Sample C: T2=1.1λ, V2=6029 m/s=1.32×V1
  Sample D: T2=0.01λ, V2=6029 m/s=1.32×V1

As presented in FIG. 5A, the sample A has a slightly smaller spurious response Sp and a slightly larger main response Mn than the sample B. As presented in FIG. 5B, in the sample C, the main response Mn is substantially the same as that of the sample A, and the spurious response Sp is slightly larger than that of the sample A. As presented in FIG. 5C, the sample D has a slightly smaller main response Mn and a slightly larger spurious response Sp than the sample A.

Figure 6:
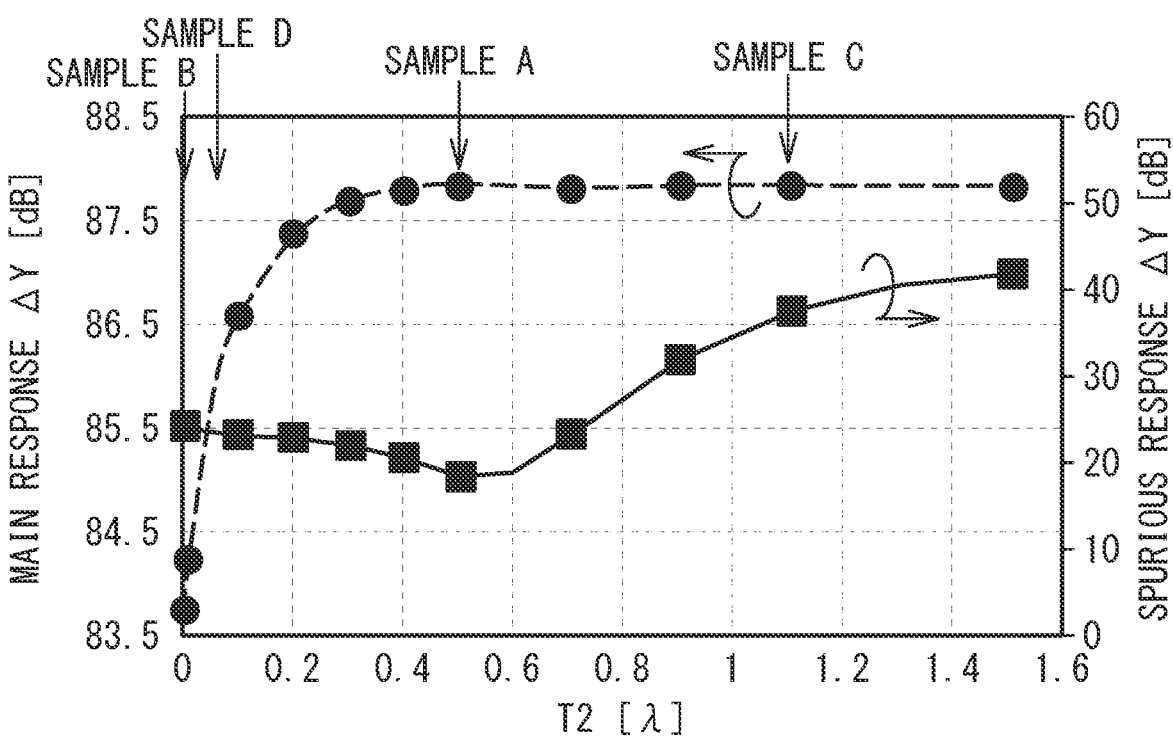
FIG. 6 is a graph presenting ΔY versus thickness T2 in the simulation 3.

FIG. 6 is a graph presenting ΔY versus thickness T2 in the simulation 3. The acoustic velocity V2 of the bulk wave in the insulating layer 12 is 6029 m/s. The case where the thickness T2=0 corresponds to the comparative example 1. The thicknesses T2 of the samples A to D are indicated by arrows. Dots indicate simulation points and curves are approximate curves. As presented in FIG. 6, when the thickness T2 is larger than 0, the main response ΔY is larger than that of the sample B of the comparative example 1. When the thickness T2 is 0.7λ or less, the spurious response ΔY is substantially the same as that of the comparative example 1. Thus, when the thickness T2 is 0.7λ or less, the spurious response ΔY is substantially the same as that of the sample B of the comparative example 1, and the main response can be increased. When the thickness T2 is 0.7λ or greater and 1.5λ or less, although the spurious response ΔY is greater than that of the sample B, the main response ΔY can be made greater than that of the sample B.

Figures 7A, 7B:
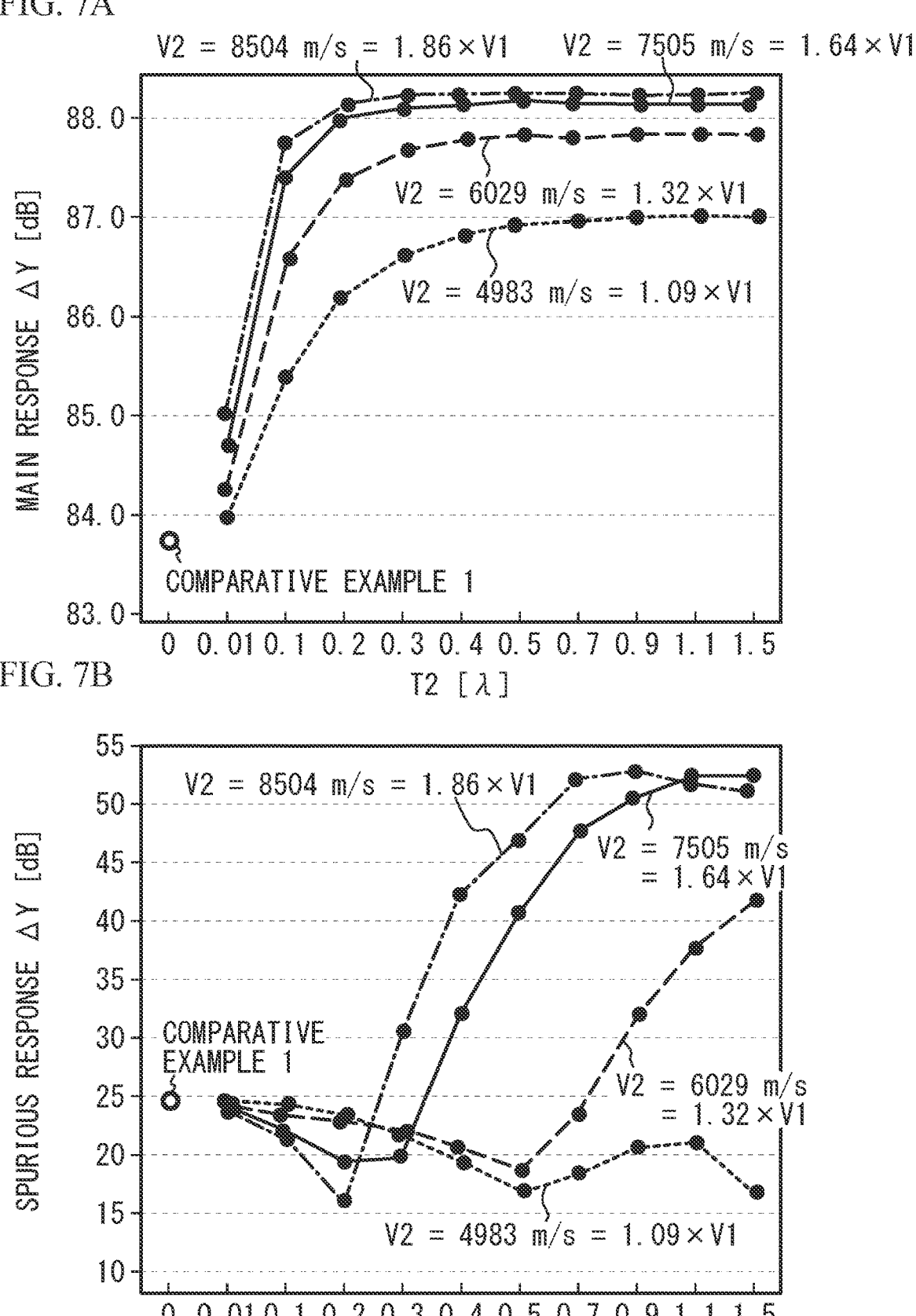
FIG. 7A and FIG. 7B are graphs presenting ΔY versus thicknesses T2 in the simulation 3.

FIG. 7A and FIG. 7B are graphs presenting ΔY versus thicknesses T2 in the simulation 3. FIG. 7A presents the main response ΔY, and FIG. 7B presents the spurious response ΔY. Dots indicate simulation points, and straight lines are lines connecting the dots. The acoustic velocity V2 in the insulating layer 12 was set to the following four levels.

V2=4983 m/s=1.09×V1
  V2=6029 m/s=1.32×V1
  V2=7505 m/s=1.64×V1
  V2=8504 m/s=1.86×V1

As presented in FIG. 7A, as the insulating layer 12 becomes thicker, the main response ΔY becomes larger. As the acoustic velocity V2 of the bulk wave in the insulating layer 12 increases, the main response ΔY increases. As presented in FIG. 7B, when the thickness T2 is increased at a certain acoustic velocity V2, the spurious response ΔY is substantially the same as that of the comparative example 1 until the thickness T2 reaches the threshold thickness. When the thickness T2 exceeds the threshold thickness, the spurious response ΔY increases. As the acoustic velocity V2 increases, the threshold thickness decreases.

As presented in FIG. 7B, for V2=1.86×V1 and V2=1.64×V1, the spurious response ΔY is saturated at about 52 dB. Considering that a spurious response ΔY of about 40 dB is effective in reducing spurious response, when the thickness T2 of the insulating layer 12 is 1.5λ or less (equal to or less than three times the average pitch D) and the acoustic velocity V2 of the bulk wave in the insulating layer 12 is equal to or less than about 1.35 times the acoustic velocity V1 of the bulk wave in the insulating layer 11, the spurious response can be reduced and the main response can be made larger than that in the comparative example 1.

When the thickness T2 of the insulating layer 12 is 0.4λ(0.8 times the average pitch D) or less and the acoustic velocity V2 of the bulk wave in the insulating layer 12 is equal to or less than about two times the acoustic velocity V1 of the bulk wave in the insulating layer 11, the spurious response can be reduced and the main response can be made larger than that of the comparative example 1.

When the acoustic velocity V2 of the bulk wave in the insulating layer 12 is equal to or less than about 1.1 times the acoustic velocity V1 of the bulk wave in the insulating layer 11, the spurious response ΔY can be made equal to or less than that in the comparative example 1 and the main response can be made larger than that in the comparative example 1. In particular, when the insulating layer 12 has a thickness T2 of about 1.5λ(three times the average pitch D) or less, the spurious response ΔY can be made substantially equal to or less than that of the comparative example 1.

When the thickness T2 of the insulating layer 12 is 0.7λ(1.4 times the average pitch D) or less and the acoustic velocity V2 of the bulk wave in the insulating layer 12 is equal to or less than about 1.35 times the acoustic velocity V1 of the bulk wave in the insulating layer 11, the spurious response can be reduced more than in the comparative example 1 and the main response can be increased more than in the comparative example 1.

Furthermore, when the thickness T2 of the insulating layer 12 is 0.3λ(0.6 times the average pitch D) or less and the acoustic velocity V2 of the bulk wave in the insulating layer 12 is equal to or less than about 1.65 times the acoustic velocity V1 of the bulk wave in the insulating layer 11, the spurious response can be reduced more than in the comparative example 1 and the main response can be increased more than in the comparative example 1.

Furthermore, when the thickness T2 of the insulating layer 12 is 0.2λ(0.4 times the average pitch D) or less and the acoustic velocity V2 of the bulk wave in the insulating layer 12 is equal to or less than about 1.9 times the acoustic velocity V1 of the bulk wave in the insulating layer 11, the spurious response can be reduced more than in the comparative example 1 and the main response can be increased more than in the comparative example 1.

In the simulation 3, a 42° rotated Y-cut X-propagation lithium tantalate substrate was used as the piezoelectric layer 14. However, in the case of a rotated Y-cut X-propagation lithium tantalate substrate, the main propagation direction of the acoustic wave is the X-axis orientation of the crystal orientations, which is the same as in the simulation 3. Therefore, the result of the simulation 3 can be applied to the case where the piezoelectric layer 14 is a rotated Y-cut X-propagation lithium tantalate substrate. A 30° to 60° rotated Y-cut X-propagation lithium tantalate substrate has an SH wave as a main mode. Therefore, in the case where the piezoelectric layer 14 is a 30° to 60° (or 36° to 50°) rotated Y-cut X-propagation lithium tantalate substrate, the result of the simulation 3 is more applicable. The acoustic wave may be a Lamb wave or the like.

In the simulation 3, a silicon oxide layer without additives was used as the insulating layer 13. However, even if another element such as fluorine is added to the silicon oxide layer, the acoustic velocity of the bulk wave in the insulating layer 13 does not change greatly. Therefore, the result of the simulation 3 can be applied to the case where the insulating layer 13 is a silicon oxide layer or a silicon oxide layer to which another element such as fluorine is added.

In the simulation 3, a polycrystalline or amorphous aluminum oxide layer is used as the insulating layer 11, and the result of the simulation 3 can be applied to the case where the insulating layer 11 is a polycrystalline or amorphous aluminum oxide layer. The insulating layer 11 may be a polycrystalline or amorphous silicon nitride layer, a polycrystalline or amorphous aluminum nitride layer, or a polycrystalline or amorphous silicon carbide layer.

When the insulating layer 11 is a polycrystalline or amorphous aluminum oxide layer, a polycrystalline or amorphous aluminum oxynitride layer, a polycrystalline or amorphous aluminum nitride layer, a polycrystalline or amorphous silicon layer, a polycrystalline or amorphous silicon nitride layer, or a polycrystalline or amorphous titanium nitride layer is used as the insulating layer 12, whereby the acoustic velocity V2 of the bulk wave in the insulating layer 12 can be made higher than the acoustic velocity V1 of the bulk wave in the insulating layer 11 and equal to or greater than about 1.35 times the acoustic velocity V1. Use of, for example, a polycrystalline or amorphous silicon carbide layer or a diamond-like carbon layer as the insulating layer 12 allows the acoustic velocity V2 of the bulk wave in the insulating layer 12 to be higher than the acoustic velocity V1 of the bulk wave in the insulating layer 11 and equal to or greater than about two times the acoustic velocity V1. Note that "material name+layer" means that the layer may contain impurities intentionally or unintentionally in addition to elements constituting the material. For example, the total amount of elements constituting the material is 80 atomic % or greater, or 90 atomic % or greater. For example, in the aluminum oxide layer, the total content of aluminum and oxygen is 80 atomic % or greater or 90 atomic % or greater.

First Variation of First Embodiment

Figure 8:
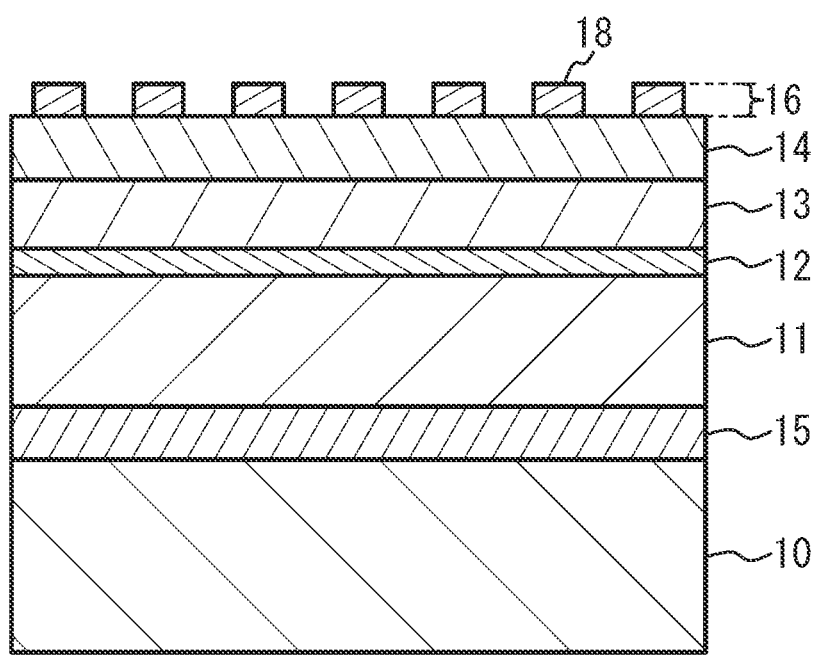
FIG. 8 is a cross-sectional view of an acoustic wave resonator in accordance with a first variation of the first embodiment.

FIG. 8 is a cross-sectional view of an acoustic wave resonator according to a first variation of the first embodiment. As illustrated in FIG. 8, an insulating layer 15 is provided between the support substrate 10 and the insulating layer 11. The insulating layer 15 is, for example, an attenuation layer having a Q factor lower than that of the insulating layer 11. Other configurations are the same as those of the first embodiment, and description thereof will be omitted.

By providing the insulating layer 15 having a low Q factor as in the first variation of the first embodiment, the unnecessary wave 52 can be further attenuated in the insulating layer 15, and thus the spurious response can be further reduced. The insulating layer 15 may be an insulating layer other than the attenuation layer. The Q factor of the insulating layer 15 is preferably equal to or less than 0.5 times, and more preferably equal to or less than 0.2 times the Q factor of the insulating layer 11.

Second Embodiment

Figure 9:
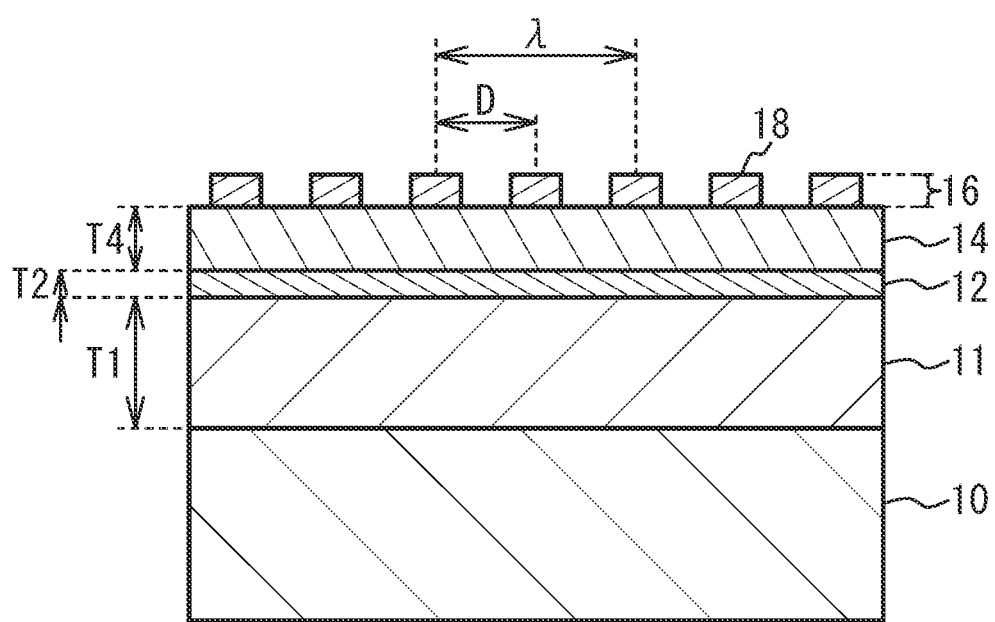
FIG. 9 is a cross-sectional view of an acoustic wave resonator in accordance with a second embodiment.

FIG. 9 is a cross-sectional view of an acoustic wave resonator in accordance with a second embodiment. As illustrated in FIG. 9, no other layer is provided between the piezoelectric layer 14 and the insulating layer 12, and the piezoelectric layer 14 and the insulating layer 12 are in direct contact with each other. Other configurations are the same as those of the first embodiment, and description thereof will be omitted.

[Simulation 4]

In the second embodiment, a simulation 4 of the main response and the spurious response was performed for different thicknesses T2 of the insulating layer 12 and different acoustic velocities of the bulk wave. The conditions of the simulation 4 are the same as those of the simulation 3 except that the insulating layer 13 is not provided. The acoustic velocity V2 of the insulating layer 12 was set to the following three levels.

V2=4983 m/s=1.09×V1
    V2=6029 m/s=1.32×V1
    V2=6882 m/s=1.50×V1

The simulations were also performed for a comparative example 2 in which the insulating layers 12 and 13 were not provided.

Figure 10A:
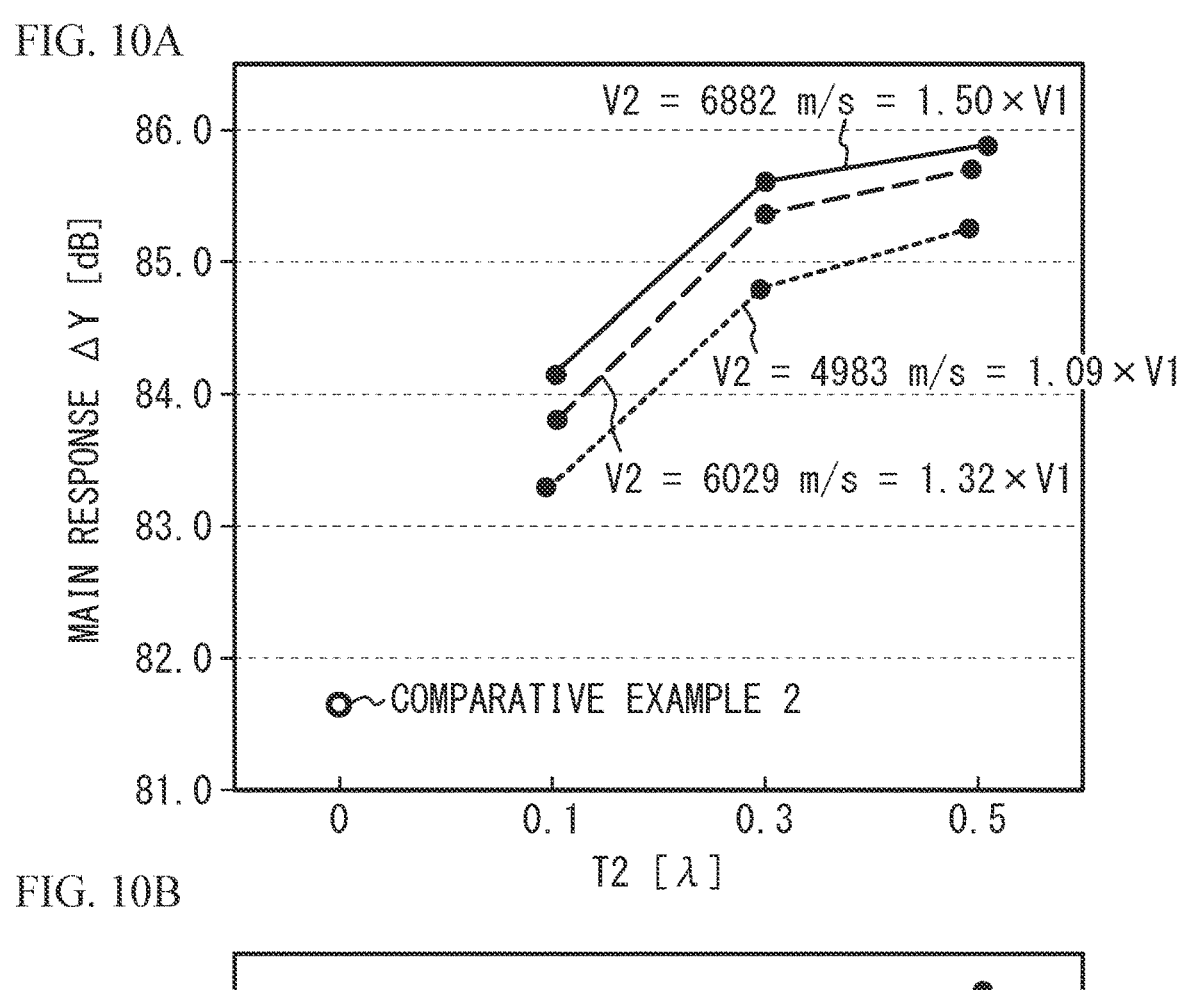
FIG. 10A and FIG. 10B are graphs presenting ΔY versus thicknesses T2 in a simulation 4.
Figure 10B:
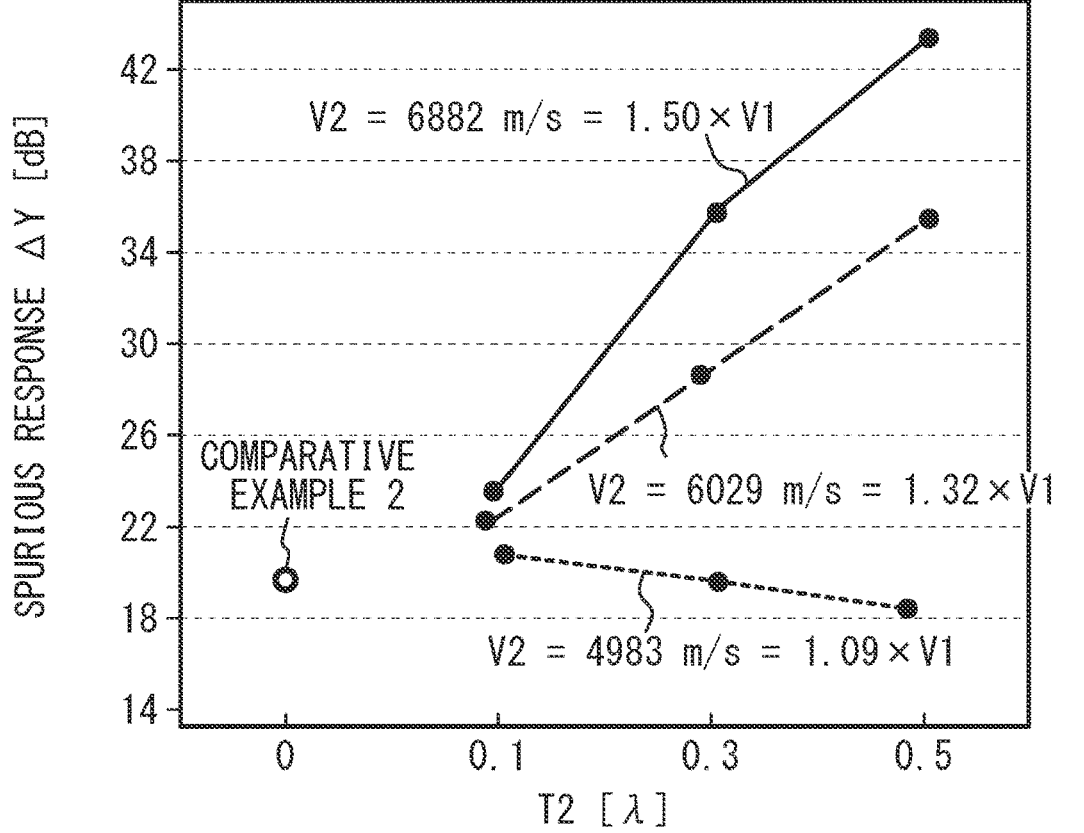

FIG. 10A and FIG. 10B are graphs presenting ΔY versus thickness T2 in the simulation 4. FIG. 10A presents the main response ΔY, and FIG. 10B presents the spurious response ΔY. Dots indicate simulation points, and straight lines are lines connecting the dots.

As presented in FIG. 10A, as the insulating layer 12 becomes thicker, the main response ΔY becomes larger. As the acoustic velocity V2 of the bulk wave in the insulating layer 12 increases, the main response ΔY increases. As presented in FIG. 10B, when V2=1.09×V1, the spurious response ΔY is substantially the same as that of the comparative example 2 regardless of the thickness T2.

Even when no other layer is provided between the piezoelectric layer 14 and the insulating layer 12 as in the simulation 4, it is possible to reduce deterioration of the main response and reduce the spurious response by providing the insulating layer 12. Note that a layer having a thickness of λ/32 or less hardly affects the characteristics. Therefore, it is preferable that another layer having a thickness of λ/32 (1/16 of the average pitch D) or greater is not provided between the piezoelectric layer 14 and the insulating layer 12. It is more preferable that another layer having a thickness of λ/64 (1/32 of the average pitch D) or greater is not provided between the piezoelectric layer 14 and the insulating layer 12. For example, an aluminum oxide layer or an aluminum oxynitride layer having a thickness of 10 nm to 100 nm may be provided between the piezoelectric layer 14 and the insulating layer 12 as a bonding layer that bonds the piezoelectric layer 14 and the insulating layer 12.

When the acoustic velocity V2 of the bulk wave in the insulating layer 12 is equal to or less than about 1.1 times the acoustic velocity V1 of the bulk wave in the insulating layer 11, the spurious response ΔY can be made equal to or less than that in the comparative example 2, and the main response can be made larger than that in the comparative example 2. In particular, when the insulating layer 12 has a thickness T2 of about 0.5λ(equal to or less than 1 time the average pitch D), the spurious response ΔY can be made equal to or less than that of the comparative example 2.

Also in the second embodiment, the insulating layer 15 of the first variation of the first embodiment may be provided between the support substrate 10 and the insulating layer 11.

In the first and second embodiments and the variation thereof, the interfaces between the layers such as the interface between the support substrate 10 and the insulating layer 11 are flat surfaces. However, at least one of the interfaces may be a rough surface having an arithmetic average roughness Ra equal to or greater than 100 nm.

Third Embodiment

Figure 11:
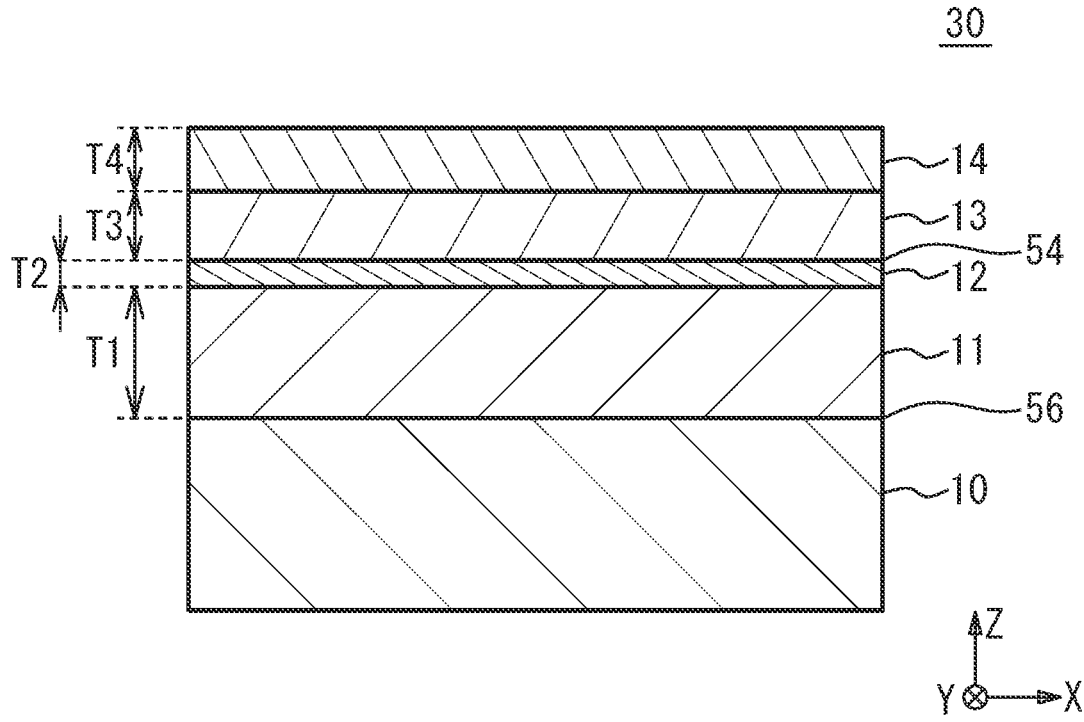
FIG. 11 is a cross-sectional view of a wafer in accordance with a third embodiment.

A third embodiment is an exemplary wafer. FIG. 11 is a cross-sectional view of a wafer in accordance with the third embodiment. As illustrated in FIG. 11, the acoustic wave resonator 26 is not provided on a wafer 30. Other configurations are the same as those in FIG. 1B of the first embodiment, and a description thereof is omitted. The wafer 30 of the third embodiment may be a wafer in which no acoustic wave resonator 26 is provided in the first and second embodiments and the variation thereof.

For the wafer 30, the piezoelectric layer 14 has a thickness T4 of, for example, 0.3×λ(i.e., 0.6×D). Therefore, in the case of the wafer 30, the average pitch D described in the first and second embodiments and the variation thereof corresponds to 1.67×T4. For example, thicknesses of 1/32, 1/16, 0.4, 0.6, 0.8, 1.4, 3 and 4 times the average pitch D correspond to 1/20, 1/10, 0.67, 1, 1.35, 2.3, 5 and 6.7 times the thickness T4 of the piezoelectric layer 14, respectively.

Fourth Embodiment

Figure 12A:
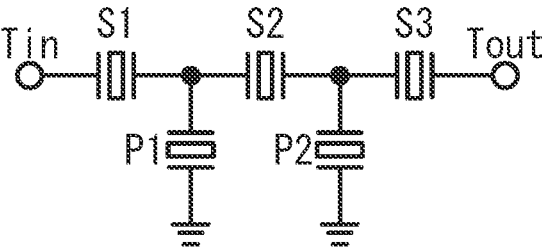
FIG. 12A is a circuit diagram of a filter in accordance with a fourth embodiment.

FIG. 12A is a circuit diagram of a filter in accordance with a fourth embodiment. As illustrated in FIG. 12A, one or more series resonators S1 to S3 are connected in series between an input terminal Tin and an output terminal Tout. One or more parallel resonators P1 and P2 are connected in parallel between the input terminal Tin and the output terminal Tout. The acoustic wave resonator in accordance with the first or second embodiment may be used for at least one of the following resonators: the one or more series resonators S1 to S3 and the one or more parallel resonators P1 and P2. The number of resonators of the ladder-type filter can be set as appropriate. The filter may be a multi-mode filter.

First Variation of Fourth Embodiment

Figure 12B:
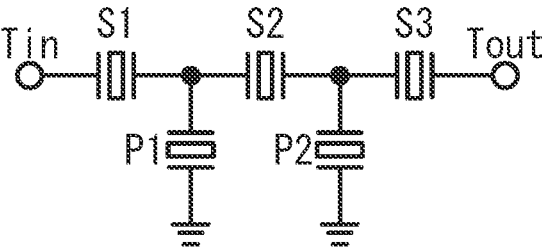
FIG. 12B is a circuit diagram of a duplexer in accordance with a first variation of the fourth embodiment.

FIG. 12B is a circuit diagram of a duplexer in accordance with a first variation of the fourth embodiment. As illustrated in FIG. 12B, a transmit filter 40 is connected between a common terminal Ant and a transmit terminal Tx. A receive filter 42 is connected between the common terminal Ant and a receive terminal Rx. The transmit filter 40 transmits a signal in the transmit band to the common terminal Ant as a transmit signal among high-frequency signals input from the transmit terminal Tx, and suppresses signals of other frequencies. The receive filter 42 transmits a signal in the receive band to the receive terminal Rx as a receive signal among high-frequency signals input from the common terminal Ant, and suppresses signals of other frequencies. At least one of the transmit filter 40 or the receive filter 42 may be the filter of the fourth embodiment.

Although the duplexer has been described as an example of the multiplexer, the multiplexer may be a triplexer or a quadplexer.

Although the embodiment of the present invention has been described in detail above, the present invention is not limited to the specific embodiment, and various modifications and changes can be made within the scope of the gist of the present invention described in the claims.

What is claimed is:
1. An acoustic wave device comprising:
a substrate;
a piezoelectric layer provided on the substrate;
at least one pair of comb-shaped electrodes provided on the piezoelectric layer, the at least one pair of comb-shaped electrodes including a plurality of electrode fingers having an average pitch equal to or greater than 0.5 times a thickness of the piezoelectric layer;

a first insulating layer provided between the substrate and the piezoelectric layer, the first insulating layer having an acoustic velocity of a bulk wave higher than an acoustic velocity of a bulk wave in the piezoelectric layer;

a second insulating layer provided between the first insulating layer and the piezoelectric layer, the second insulating layer having an acoustic velocity of a bulk wave higher than the acoustic velocity of the bulk wave in the first insulating layer, and a third insulating layer provided between the piezoelectric layer and the second insulating layer, the third insulating layer being a silicon oxide layer or a silicon oxide layer to which fluorine is added, wherein an acoustic velocity of a bulk wave in the substrate is higher than the acoustic velocity of the bulk wave in the second insulating layer, and wherein a distance between an interface between the second insulating layer and the third insulating layer and an interface between the piezoelectric layer and the at least one pair of comb-shaped electrodes is equal to or less than four times the average pitch.

2. The acoustic wave device according to claim 1, wherein the piezoelectric layer is a rotated Y-cut X-propagation lithium tantalate substrate, and wherein the acoustic velocity of the bulk wave in the second insulating layer is equal to or less than 1.1 times the acoustic velocity of the bulk wave in the first insulating layer.

3. The acoustic wave device according to claim 2, wherein a thickness of the second insulating layer is equal to or less than three times the average pitch.

4. The acoustic wave device according to claim 2, wherein the first insulating layer is a polycrystalline or amorphous aluminum oxide layer.

5. The acoustic wave device according to claim 2, wherein the first insulating layer is a polycrystalline or amorphous silicon nitride layer, a polycrystalline or amorphous aluminum nitride layer, or a polycrystalline or amorphous silicon carbide layer.

6. The acoustic wave device according to claim 1, wherein the piezoelectric layer is a rotated Y-cut X-propagation lithium tantalate substrate, wherein a thickness of the second insulating layer is equal to or less than four times the average pitch, and wherein the acoustic velocity of the bulk wave in the second insulating layer is equal to or less than two times the acoustic velocity of the bulk wave in the first insulating layer.

7. The acoustic wave device according to claim 1, wherein the piezoelectric layer is a rotated Y-cut X-propagation lithium tantalate substrate, wherein a thickness of the second insulating layer is equal to or less than three times the average pitch, and wherein the acoustic velocity of the bulk wave in the second insulating layer is equal to or less than 1.35 times the acoustic velocity of the bulk wave in the first insulating layer.

8. The acoustic wave device according to claim 1, wherein the piezoelectric layer is a rotated Y-cut X-propagation lithium tantalate substrate, wherein a thickness of the second insulating layer is equal to or less than 0.8 times the average pitch, and wherein the acoustic velocity of the bulk wave in the second insulating layer is equal to or less than two times the acoustic velocity of the bulk wave in the first insulating layer.

9. A filter comprising the acoustic wave device according to claim 1.

10. A multiplexer comprising the filter according to claim 9.

11. An acoustic wave device comprising:

a substrate;

a piezoelectric layer provided on the substrate;

at least one pair of comb-shaped electrodes provided on the piezoelectric layer, the at least one pair of comb-shaped electrodes including a plurality of electrode fingers having an average pitch equal to or greater than 0.5 times a thickness of the piezoelectric layer;

a first insulating layer provided between the substrate and the piezoelectric layer, the first insulating layer having an acoustic velocity of a bulk wave higher than an acoustic velocity of a bulk wave in the piezoelectric layer; and a second insulating layer provided between the first insulating layer and the piezoelectric layer, the second insulating layer having an acoustic velocity of a bulk wave higher than the acoustic velocity of the bulk wave in the first insulating layer, wherein an acoustic velocity of a bulk wave in the substrate is higher than the acoustic velocity of the bulk wave in the second insulating layer, wherein no other layer having a thickness equal to or greater than $1/16$ times the average pitch is provided between the piezoelectric layer and the second insulating layer, wherein the piezoelectric layer is a rotated Y-cut X-propagation lithium tantalate substrate, and wherein the acoustic velocity of the bulk wave in the second insulating layer is equal to or less than 1.1 times the acoustic velocity of the bulk wave in the first insulating layer.

12. A filter comprising the acoustic wave device according to claim 11.

13. A multiplexer comprising the filter according to claim 12.

14. An acoustic wave device comprising:

a substrate that is a monocrystalline sapphire substrate;

a piezoelectric layer provided on the substrate, the piezoelectric layer being a rotated Y-cut X-propagation lithium tantalate substrate;

at least one pair of comb-shaped electrodes provided on the piezoelectric layer, the at least one pair of comb-shaped electrodes including a plurality of electrode fingers having an average pitch equal to or greater than 0.5 times a thickness of the piezoelectric layer;

a first insulating layer provided between the substrate and the piezoelectric layer, the first insulating layer being a polycrystalline or amorphous aluminum oxide layer;

a second insulating layer provided between the first insulating layer and the piezoelectric layer, the second insulating layer having a thickness equal to or less than three times the average pitch, the second insulating layer being a polycrystalline or amorphous aluminum oxynitride layer, a polycrystalline or amorphous aluminum nitride layer, a polycrystalline or amorphous silicon layer, a polycrystalline or amorphous silicon nitride layer, or a polycrystalline or amorphous titanium nitride layer; and a third insulating layer provided between the piezoelectric layer and the second insulating layer, a distance between an interface between the third insulating layer and the second insulating layer and an interface between the piezoelectric layer and the at least one pair of comb-shaped electrodes being equal to or less than two times the average pitch, the third insulating layer being a silicon oxide layer or a silicon oxide layer to which fluorine is added.

15. A filter comprising the acoustic wave device according to claim 14.

16. A multiplexer comprising the filter according to claim 15.

\* \* \* \* \*